(12) United States Patent
Imre

(10) Patent No.: US 11,598,819 B2
(45) Date of Patent: Mar. 7, 2023

(54) METHOD FOR ASCERTAINING A CHARGE STATE OF A BATTERY SYSTEM, BATTERY SYSTEM

(71) Applicant: Robert Bosch GmbH, Stuttgart (DE)

(72) Inventor: Arpad Imre, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/475,514

(22) Filed: Sep. 15, 2021

(65) Prior Publication Data

US 2022/0082632 A1 Mar. 17, 2022

(30) Foreign Application Priority Data

Sep. 15, 2020 (DE) ...................... 10 2020 211 534.6

(51) Int. Cl.
| | |
|---|---|
| *G01R 31/396* | (2019.01) |
| *G01R 31/3828* | (2019.01) |
| *B60R 16/033* | (2006.01) |
| *H02J 7/00* | (2006.01) |
| *G01R 31/3842* | (2019.01) |

(52) U.S. Cl.
CPC .......... *G01R 31/396* (2019.01); *B60R 16/033* (2013.01); *G01R 31/3828* (2019.01); *G01R 31/3842* (2019.01); *H02J 7/0048* (2020.01)

(58) Field of Classification Search
None
See application file for complete search history.

(56) References Cited

U.S. PATENT DOCUMENTS

2017/0242078 A1* 8/2017 Kuper ................. H01M 10/425

FOREIGN PATENT DOCUMENTS

| DE | 102013201346 A1 | 7/2014 |
|---|---|---|
| DE | 102013219360 A1 | 3/2015 |
| JP | 2016032415 A | 3/2016 |

* cited by examiner

*Primary Examiner* — Jas A Sanghera
(74) *Attorney, Agent, or Firm* — Michael Best & Friedrich LLP

(57) ABSTRACT

Ascertaining a charge state of a battery system that includes at least one battery cell and one additional energy store that is connected in series with the at least one battery cell and can be switched in and out. One method includes switching in the additional energy store; measuring a voltage of the additional energy store at predefined time intervals; ascertaining a capacity change of the additional energy store with reference to the measured voltage and to a characteristic voltage curve of the additional energy store; ascertaining a charge throughput of the additional energy store with reference to the ascertained capacity change of the additional energy store; and ascertaining the charge state of the battery system with reference to the ascertained charge throughput.

8 Claims, 3 Drawing Sheets

METHOD FOR ASCERTAINING A CHARGE STATE OF A BATTERY SYSTEM, BATTERY SYSTEM

BACKGROUND OF THE INVENTION

The invention relates to a method for ascertaining a charge state of a battery system that comprises at least one battery cell and one additional energy store that is connected in series with the at least one battery cell and can be switched in and out. The invention also relates to a battery system that is configured to carry out the proposed method according to the invention.

The invention further relates to a vehicle that is configured to carry out the proposed method according to the invention and/or that comprises the proposed battery system according to the invention.

The power supply to the safety-relevant components such as braking assistance, steering assistance, automatic steering/braking during highly automated driving, during driving, and to the control devices that are repeatedly activated in the parking phase is nowadays usually ensured in vehicles by a 12 V/24 V lead-acid battery. These lead-acid batteries may in future be replaced by lithium-ion batteries. This new battery type must satisfy the requirements placed on the lead-acid batteries, and in particular the voltage level of the new batteries must as a rule normally lie between 9 V and 15 V. In addition, the energy availability for the safety-relevant components in what is known as a safety maneuver must be guaranteed with at least ASIL (Automotive Safety Integrity Level) B(D). To satisfy the voltage requirements, four lithium-iron phosphate cells (LFP cells) are usually connected in series with one another. The lithium-iron phosphate cells have a very flat open-circuit voltage (OCV) curve, which makes the precise estimation of the state of charge (SOC) that is necessary for energy availability more difficult. This requires continuous current integration during both travel and when parked. According to the prior art, the current is measured continuously as the voltage drop across a measurement resistor. This entails a battery management system that operates continuously for the integration and evaluation. The battery management system, however, consumes a current of up to 10 mA, which necessitates a cost-intensive over-dimensioning of the 12 V lithium ion battery. For example, a long-term park of 30 days makes an over-dimensioning of about 7 Ah (90 Wh) necessary for supplying the battery management system alone. With a usable capacity of 20 Ah, this represents an over-dimensioning, and a cost increase, of about 30%.

The document JP 2016-32415 A describes a series-parallel battery pack and a method for controlling the series-parallel battery pack. The series-parallel battery pack here comprises a plurality of rechargeable batteries.

The document DE 10 2013 201 346 A1 describes a device and method for ascertaining the charge state of an energy store. The open-circuit voltage of the energy store is ascertained here by applying an additional DC voltage.

SUMMARY OF THE INVENTION

A method for ascertaining a charge state of a battery system is proposed. The battery system here comprises at least one battery cell and one additional energy store. The additional energy store is connected here in series with the at least one battery cell. The additional energy store can here be switched in and out. If the battery system comprises a plurality of battery cells, then these can be connected together in series or in parallel. If the battery cells are connected in parallel at the cell level, only one additional energy store is necessary. If the battery cells are connected in a series string, and the strings are connected in parallel, one additional energy store is preferably provided for each string.

The additional energy store is preferably rechargeable. The additional energy store can, for example, be designed as a secondary battery cell or as a capacitor. As soon as the additional energy store is discharged, it is charged up again fully. The additional energy store must satisfy the current requirements during switched-in operation. The additional energy store can have a lower capacity than the battery cells, and can differ in voltage. The additional energy store preferably has a steep open-circuit voltage curve.

According to the invention, the additional energy store is first switched in. A voltage of the additional energy store is then measured at predefined time intervals. The frequency of these voltage measurements can lie between several hours and several days, depending on the dimensioning of the additional energy store, on an actual current consumption of the battery management system, and on a required precision of the charge state ascertainment.

A capacity change of the additional energy store is accordingly ascertained with reference to the measured voltage and to an open-circuit voltage curve (OCV-SOC curve) of the additional energy store. Preferably, an SOC estimator algorithm is additionally used with the equivalent circuit diagram of the additional energy store when the current is not equal to zero.

A charge throughput of the additional energy store is then ascertained with reference to the ascertained capacity change of the additional energy store. The charge state of the battery system is then ascertained with reference to the ascertained charge throughput.

The temperature and the self-discharge rate, along with other variables of the additional energy store and of the individual battery cells, are also taken into consideration in the ascertainment of the charge throughput of the additional energy store and the charge state of the battery system. The capacity change (in Ah) of the battery system is found by subtracting the difference between the self-discharge in the period of time between the battery system or the at least one battery cell and the additional energy store from the capacity change of the additional energy store.

The method proposed according to the invention preferably comprises further method steps. The additional energy store is here switched out. The current profile of the battery system over time is then ascertained. The current can be ascertained here using a measuring resistor connected in series with the at least one battery cell. The current here is ascertained continuously as the voltage drop across the measurement resistor. The current of the battery system can also be ascertained using a current sensor. The charge state of the battery system is then ascertained with reference to the ascertained current of the battery system. The charge throughput of the battery system is ascertained here from a continuous integration of the ascertained current through the measurement resistor. The charge state of the battery system is ascertained on the basis of this ascertained charge throughput. The ascertainment of the charge state by integrating a current is also referred to as Coulomb-counting.

An offset error that can occur in the current measurement, as for example with an A/D (analog-digital) converter or a current sensor, can here be corrected for through regular full charging, which refers to the charge state of the battery system being greater than 95%, using a simulated open-circuit voltage of the additional energy store and open-circuit voltage curves of the additional energy store.

The proposed method according to the invention also preferably comprises further method steps:
  switching out the additional energy store;
  measuring the voltage of individual battery cells;
  fully charging the battery cells;
  correcting the charge state of the individual battery cells with reference to the measured open-circuit voltage in the fully charged state.

A battery system is also proposed. The battery system is configured here to carry out a proposed method according to the invention. The battery system here comprises at least one battery cell and an additional energy store that is connected in series with the at least one battery cell and that can be switched in and out. For monitoring and control of the battery system proposed according to the invention, the battery system has a battery management system in which the method proposed according to the invention can be implemented as an executable computer program.

Preferably the battery management system is configured with a sleep mode and an operating mode. In the sleep mode, the battery management system is regularly started up for a short period in accordance with a software cycle-time programmed in the battery management system. During this "wake time" the battery management system carries out a check of the battery system in order to examine all the data such as voltages, temperatures, charge state etc. for possible changes or faults. A battery management can at the same time control measures to optimize the performance capacity and service life of the battery system. This means, for example: ensuring a suitable temperature level by cooling and, if relevant, heating. The battery management system is in the sleep mode if, for example, a vehicle has been switched off or is in a parking phase. In the operating mode, the battery management system is awake, and the states of the battery system such as the voltage, current and temperature are continuously monitored, and measures introduced if faults are present in the battery system. The battery management system is, for example, in operating mode when the vehicle is switched on.

The additional energy store is switched in when the battery management system is in sleep mode. The battery management system wakes up regularly from the sleep mode, which means that the battery management system goes into operating mode, and the charge state of the battery system is ascertained by means of voltage measurement and the open-circuit voltage curve of the additional energy store. When the additional energy store is discharged, it is fully charged up again. After the additional energy store is again fully charged, the battery module enters sleep mode again. A precise ascertainment of charge state is enabled in this way with a very low current consumption. The additional energy store can be charged here by the battery system via a voltage monitoring line.

The capacity of the additional energy store is selected such that the battery management system can remain in sleep mode for a long time, for several hours, for example.

The proposed battery system according to the invention can comprise a single-pole changeover switch for switching the additional energy store in and out. Alternatively, the proposed battery system according to the invention can comprise a switching apparatus for switching the additional energy store on and off. The switching apparatus here comprises a first switch with which the additional energy store is switched off, and can be bridged by a bypass line in which a second switch is accommodated.

To ascertain the current of the proposed battery system according to the invention, it can comprise a measurement resistor that is connected in series with the at least one battery cell. The current is ascertained with reference to a voltage drop at the measurement resistor. It is also conceivable that the proposed battery system according to the invention comprises a current sensor for acquiring the current of the battery system.

The additional energy store is advantageously designed as a secondary battery cell, for example a lithium-ion battery cell. This secondary battery cell must have a steep open-circuit voltage curve, for example a lithium ion battery cell with, for example, NMC, NCA or LTO chemistry.

The additional energy store can alternatively be designed as a capacitor. The additional energy store can, for example, be designed as a supercapacitor.

The invention further relates to a vehicle that is configured to carry out the proposed method according to the invention and/or that comprises the proposed battery system according to the invention. The proposed method according to the invention can here be carried out in such a way that when the vehicle is travelling the additional energy store is switched out, and the charge state of the proposed battery system according to the invention is ascertained by ascertaining the current of the proposed battery system according to the invention, whereas when the proposed vehicle according to the invention is in a parked phase, the additional energy store is switched in, and the charge state of the proposed battery system according to the invention is ascertained by means of voltage measurements and of the open-circuit voltage curve of the additional energy store.

The current consumption of a battery management system in parked phases of a vehicle is significantly reduced with the proposed method according to the invention. The battery management system can thus remain in sleep mode for a longer time. In addition, the proposed method according to the invention enables at least one ASIL B with the ascertainment of the charge state to be achieved with a low current consumption.

An ASIL C can furthermore be achieved with low costs since only a small over-dimensioning of the battery system for reasons of battery self-discharge is required.

The availability of the battery system can furthermore be increased with the proposed method according to the invention.

A higher usable energy of the battery system is in addition achieved, since, with the proposed method according to the invention, an additional capacity reserve for ascertaining the charge state is not required.

The charge state of the battery system can be ascertained reliably with the proposed method according to the invention, which means that secure operation and energy supply of components relevant to driving safety are enabled.

The charge state of a battery system with a flat open-circuit voltage curve such as a battery system with LFP cells can furthermore be ascertained more accurately with the proposed method according to the invention.

BRIEF DESCRIPTION OF THE DRAWINGS

Embodiments of the invention are explained in more detail with reference to the drawings and the following description,
  in which:
FIG. 2 shows a schematic illustration of the battery system, wherein the additional energy store is switched in.

DETAILED DESCRIPTION

In the following description of the embodiments of the invention, identical or similar elements are given the same reference signs, and a repeated description of these elements is omitted in individual cases. The figures only represent the object of the invention schematically.

Figure 1:
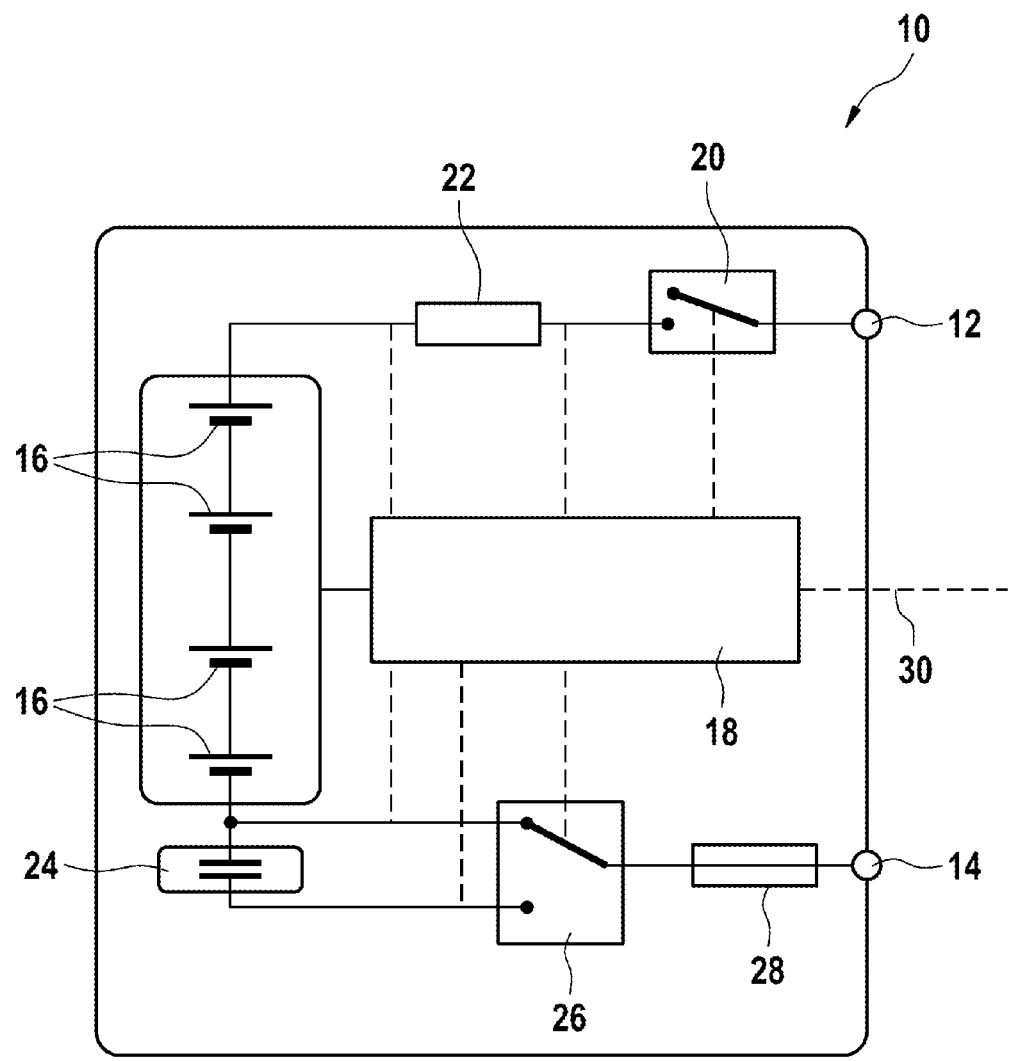
FIG. 1 shows a schematic illustration of a battery system with an additional energy store that is switched out.

FIG. 1 shows a schematic illustration of a battery system 10 for supply of energy to an on-board electrical system of a vehicle such as a 12 V on-board electrical system. The battery system 10 is configured here to carry out the proposed method according to the invention.

The battery system 10 here comprises a positive battery terminal 12 and a negative battery terminal 14. The battery system 10 further comprises four battery cells 16 connected in series with one another and a battery management system 18 for monitoring and controlling the battery system 10.

The battery system 10 further comprises a safety circuit breaker 20 for disconnecting the battery system 10 from the on-board electrical system of the vehicle. The battery management system 18 is configured here to control the safety circuit breaker 20.

The battery system 10 comprises a measurement resistor 22 to ascertain a current of the battery system 10. The battery management system 18 is configured here to measure a voltage drop at the measurement resistor 22 and to ascertain the current of the battery system 10.

The battery system 10 further comprises an additional energy store 24 connected in series with the battery cells 16, which, in the present case in FIG. 1, is switched out from the battery cells 16 by a single-pole changeover switch 26 that is controlled by the battery management system 18. The additional energy store 24 can be designed here as a secondary battery cell such as a lithium-ion battery cell or as a capacitor, for example a supercapacitor.

The battery system 10 further comprises a fuse 28 to protect the battery system 10 from over-current, and a communication interface 30 for communication with other components of the vehicle such as a vehicle control unit (VCU).

In the present case in FIG. 1, the battery system 10 is illustrated in an operating mode after switching the vehicle on, or when the vehicle is travelling. The battery management system 18 is configured here to ascertain the charge state of the battery system 10 from a continuous integration of the ascertained current of the battery system 10.

An offset error can here be corrected for through regular full charging, which refers to the charge state of the battery system being greater than 95%, using a simulated open-circuit voltage of the additional energy store and open-circuit voltage curve of the additional energy store.

Figure 2:
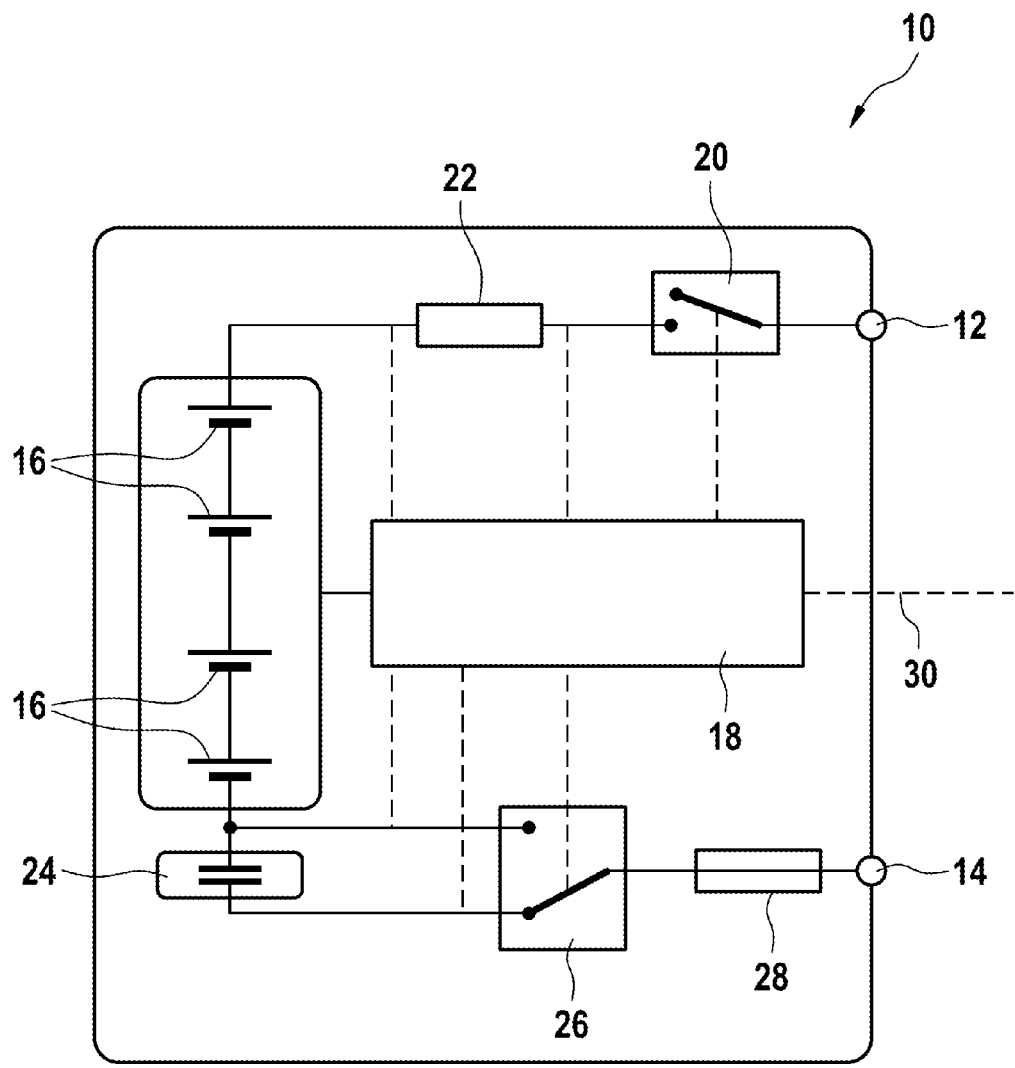

FIG. 2 shows a schematic illustration of the battery system 10 in FIG. 1, wherein the additional energy store 24 is connected to the battery cells 16 by the single-pole changeover switch 26.

In the present case in FIG. 2, the battery system 10 is illustrated in a sleep mode after switching the vehicle off, or when the vehicle is in a parked phase. The battery management system 18 is configured here to measure the voltage of the additional energy store 24 at predefined time intervals. The frequency of these voltage measurements can lie between several hours and several days, depending on the dimensioning of the additional energy store 24, on an actual current consumption of the battery management system 18, and on a required precision of the charge state ascertainment. The battery management system 18 is here also configured to ascertain the charge throughput of the additional energy store 24 on the basis of the measured voltage and of the characteristic voltage curve of the additional energy store 24, taking the temperature and the self-discharge rate of the additional energy store 24 etc. into consideration, and to calculate the charge state of the battery system 10.

As soon as the additional energy store 24 is discharged, the battery management system 18 wakes up, meaning that the battery management system 18 enters the operating mode and again fully charges the additional energy store 24. After the additional energy store 24 is again fully charged, the battery management system 18 again enters sleep mode.

Figure 3:
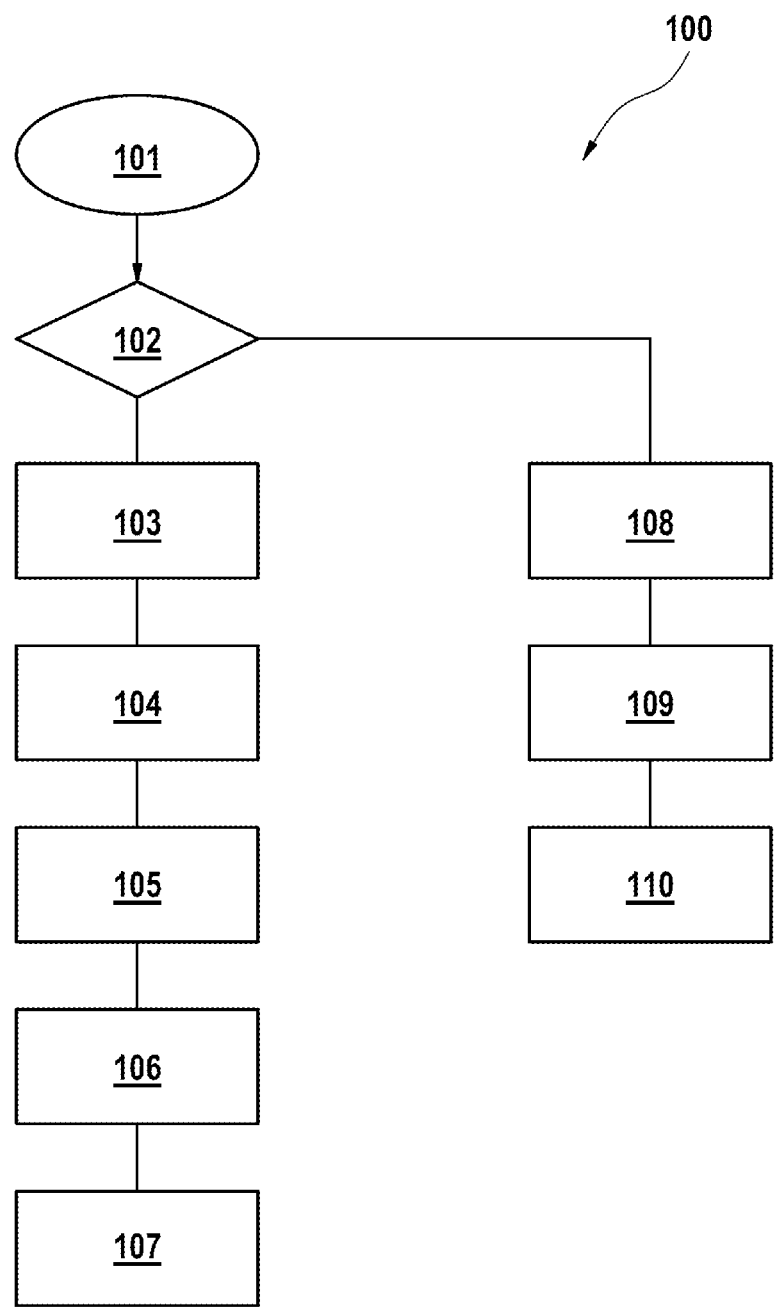
FIG. 3 shows a schematic illustration of a process flow for ascertaining the charge state of the battery system.

FIG. 3 shows a schematic illustration of a process flow 100 for ascertaining the charge state of the battery system 10.

The proposed method according to the invention is started in a method step 101. At the same time, a state of the battery management system 18 is detected in a method step 102. Whether the battery management system 18 is in a sleep mode or in an operating mode is detected here.

If the battery management system 18 is in a sleep mode, then in a method step 103 the additional energy store 24 is switched in. The voltage of the additional energy store 24 is then measured at predefined time intervals in a method step 104.

A capacity change of the additional energy store 24 is ascertained in a method step 105 with reference to the measured voltage and the characteristic voltage curve of the additional energy store 24.

After this, a charge throughput of the additional energy store 24 is ascertained in a method step 106 with reference to the capacity change of the additional energy store 24.

In a method step 107 the charge state of the battery system 10 is ascertained with reference to the charge throughput of the additional energy store 24. The temperature, the self-discharge rate and other variables of the additional energy store 24 are also taken into consideration here.

If the battery management system 18 is in an operating mode, then the additional energy store 24 is switched out in a method step 108. After this, a current of the battery system 10 is ascertained continuously in a method step 109. A measurement resistor or a current sensor can be employed here.

The charge state of the battery system 10 is ascertained in a method step 110 from a continuous integration of the current with reference to the ascertained current of the battery system 10.

The invention is not restricted to the exemplary embodiments described here and the aspects emphasized therein. Rather a large number of modifications that lie within the scope of skilled activity is possible within the range given by the claims.

The invention claimed is:

1. A method for ascertaining a charge state of a battery system (10) that comprises at least one battery cell (16) and one additional energy store (24) that is connected in series with the at least one battery cell (16) and can be switched in and out, comprising the following method steps:
   switching in the additional energy store (24);
   measuring a voltage of the additional energy store (24) at predefined time intervals;

ascertaining a capacity change of the additional energy store (24) with reference to the measured voltage and to a characteristic voltage curve of the additional energy store (24);

ascertaining a charge throughput of the additional energy store (24) with reference to the ascertained capacity change of the additional energy store (24);

ascertaining the charge state of the battery system (10) with reference to the ascertained charge throughput.

2. The method according to claim 1, further comprising the following method steps:

switching out the additional energy store (24);

ascertaining the current profile of the battery system (10) over time;

ascertaining the charge state of the battery system (10) with reference to the ascertained charge throughput of the battery system (10).

3. The method according to claim 1, further comprising the following method steps:

switching out the additional energy store (24);

measuring the voltage of individual battery cells (16);

fully charging the battery cells (16);

correcting the charge state of the individual battery cells (16) with reference to a measured open-circuit voltage in the fully charged state.

4. A battery system (10) comprising:

at least one battery cell (16) and one additional energy store (24) that is connected in series with the at least one battery cell (16) and can be switched in and out, and wherein the battery system is configured to switch in the additional energy store (24);

measure a voltage of the additional energy store (24) at predefined time intervals;

ascertain a capacity change of the additional energy store (24) with reference to the measured voltage and to a characteristic voltage curve of the additional energy store (24);

ascertain a charge throughput of the additional energy store (24) with reference to the ascertained capacity change of the additional energy store (24); and ascertain the charge state of the battery system (10) with reference to the ascertained charge throughput.

5. The battery system (10) according to claim 4, wherein the additional energy store (24) is designed as a secondary battery cell.

6. The battery system (10) according to claim 4, wherein the additional energy store (24) is designed as a capacitor.

7. The battery system (10) according to claim 4, wherein the additional energy store (24) is designed as a supercapacitor.

8. A vehicle comprising a battery system (10) that includes at least one battery cell (16) and one additional energy store (24) that is connected in series with the at least one battery cell (16) and can be switched in and out, and wherein the battery system is configured to switch in the additional energy store (24);

measure a voltage of the additional energy store (24) at predefined time intervals;

ascertain a capacity change of the additional energy store (24) with reference to the measured voltage and to a characteristic voltage curve of the additional energy store (24);

ascertain a charge throughput of the additional energy store (24) with reference to the ascertained capacity change of the additional energy store (24); and ascertain the charge state of the battery system (10) with reference to the ascertained charge throughput.

* * * * *